(12) United States Patent
Chan et al.

(10) Patent No.: US 8,716,825 B2
(45) Date of Patent: May 6, 2014

(54) SEMICONDUCTOR STRUCTURE AND MANUFACTURING METHOD FOR THE SAME

(75) Inventors: Wing-Chor Chan, Hsinchu (TW); Chung-Yu Hung, Ershuei Township, Changhua County (TW); Chien-Wen Chu, Yangmei Township, Taoyuan County (TW)

(73) Assignee: Macronix International Co., Ltd., Hsinchu (TW)

( * ) Notice: Subject to any disclaimer, the term of this patent is extended or adjusted under 35 U.S.C. 154(b) by 191 days.

(21) Appl. No.: 13/166,091

(22) Filed: Jun. 22, 2011

(65) Prior Publication Data

US 2012/0326261 A1    Dec. 27, 2012

(51) Int. Cl.
*H01L 29/66*    (2006.01)

(52) U.S. Cl.
USPC ............... 257/476; 438/451; 257/E29.338

(58) Field of Classification Search
USPC ............ 257/476, E29.338, E21.359; 438/451
See application file for complete search history.

(56) References Cited

U.S. PATENT DOCUMENTS

| 7,180,132 B2 * | 2/2007 | Cai et al. ................ 257/342 |
| 2007/0102725 A1 * | 5/2007 | Magri' et al. ............. 257/155 |

* cited by examiner

*Primary Examiner* — Julio J Maldonado
*Assistant Examiner* — Robert Bachner
(74) *Attorney, Agent, or Firm* — McClure, Qualey & Rodack, LLP

(57) ABSTRACT

A semiconductor structure and a manufacturing method for the same are provided. The semiconductor structure includes a well region, a dielectric structure, a first doped layer, a second doped layer and a first doped region. The dielectric structure is on the well region. The dielectric structure has a first dielectric sidewall and a second dielectric sidewall opposite to each other. The dielectric structure includes a first dielectric portion and a second dielectric portion, between the first dielectric sidewall and the second dielectric sidewall. The first doped layer is on the well region between the first dielectric portion and the second dielectric portion. The second doped layer is on the first doped layer. The first doped region is in the well region on the first dielectric sidewall.

14 Claims, 8 Drawing Sheets

SEMICONDUCTOR STRUCTURE AND MANUFACTURING METHOD FOR THE SAME

BACKGROUND

1. Technical Field

The disclosure relates in general to a semiconductor structure and a manufacturing method for the same, and more particularly to a HV device and a manufacturing method for the same.

2. Description of the Related Art

In the semiconductor technique, the feature size has been reduced. In the meantime, the rate, the efficiency, the density and the cost per integrated circuit unit have been improved. For example, a diode of a semiconductor structure, such as Schottky diode, can be applied for an asynchronous device. A conventional Schottky diode is formed by forming a metal contact, a field oxide isolation (FOX) and an N-type heavily doped portion on a N-type substrate. The metal contact and the N-type heavily doped portion, respectively on the substrate on two opposite sides of the single FOX, are electrically connected to an anode and a cathode respectively.

The asynchronous device usually have two power MOSFETS, respectively disposed at a high side and a low side of the device. The Schottky diode can be applied to the MOSFET at the low side, for reducing the power loss in a buck DC-to-DC conversion. However, when operated by a reverse bias, the conventional Schottky diode has a leakage current that seriously influent the efficiency of the device disadvantageously. The leakage current results in the power loss in the circuit. Referring to FIG. 1, for example, when operated by a reverse bias, the leakage current of the conventional Schottky diode is gradually increased with the voltage with a linear relationship therebetween. In addition, the breakdown down of the conventional Schottky diode would not be happened. Therefore, when applied for the HV device, the conventional Schottky diode has the shift voltage level.

SUMMARY

A semiconductor structure is provided. The semiconductor structure comprises a well region, a dielectric structure, a first doped layer, a second doped layer and a first doped region. The dielectric structure is on the well region. The dielectric structure has a first dielectric sidewall and a second dielectric sidewall opposite to each other. The dielectric structure comprises a first dielectric portion and a second dielectric portion, between the first dielectric sidewall and the second dielectric sidewall. The first doped layer is on the well region between the first dielectric portion and the second dielectric portion. The second doped layer is on the first doped layer. The first doped region is in the well region on the first dielectric sidewall. The well region, the first doped layer and the first doped region have a first conductivity type. The second doped layer has a second conductivity type opposite to the first conductivity type. A cathode is electrically connected to the first doped region. An anode is electrically connected to the well region on the second dielectric sidewall.

A semiconductor structure is also provided. The semiconductor structure comprises a well region, a dielectric structure, a first doped region, a second doped region and a third doped region. The dielectric structure is on the well region. The dielectric structure has a first dielectric sidewall and a second dielectric sidewall opposite to each other. The first doped region is in the well region on the first dielectric sidewall. The second doped region and the third doped region are in the well region on the second dielectric sidewall. The well region and the first doped region have a first conductivity type. The second doped region and the third doped region have a second conductivity type opposite to the first conductivity type. A cathode is electrically connected to the first doped region. An anode is electrically connected to the well region between the second doped region and the third doped region, the second doped region and the third doped region.

A manufacturing method for a semiconductor structure is provided. The method comprises following steps. A dielectric structure is formed on a well region. The dielectric structure has a first dielectric sidewall and a second dielectric sidewall opposite to each other. The dielectric structure comprises a first dielectric portion and a second dielectric portion, between the first dielectric sidewall and the second dielectric sidewall. A first doped layer is formed. The first doped layer is on the well region between the first dielectric portion and the second dielectric portion. A second doped layer is formed on the first doped layer. A first doped region is formed. The first doped region is in the well region on the first dielectric sidewall. The well region, the first doped layer and the first doped region have a first conductivity type. The second doped layer has a second conductivity type opposite to the first conductivity type.

A manufacturing method for a semiconductor structure is provided. The method comprises following steps. A dielectric structure is formed on a well region. The dielectric structure has a first dielectric sidewall and a second dielectric sidewall opposite to each other. A first doped region is formed in the well region on the first dielectric sidewall. A second doped region and a third doped region are formed. The second doped region and the third doped region are in the well region on the second dielectric sidewall. The second doped region and the third doped region are separated from each other by the well region. The well region and the first doped region have a first conductivity type. The second doped region and the third doped region have a second conductivity type opposite to the first conductivity type.

DETAILED DESCRIPTION

Embodiments relate to a semiconductor structure and a manufacturing method for the semiconductor structure. The semiconductor structure has an element using RESURF concept on a drift region between dielectric portions separated from each other. Therefore, the operating voltage of the device can be increased. A portion of the semiconductor structure electrically connected to an anode has a pinching element. Thus, the leakage current of the device can be decreased. The semiconductor structure can be applied to a HV device. The semiconductor structure may include a Schottky diode that can be operated by a high voltage.

Figure 1:
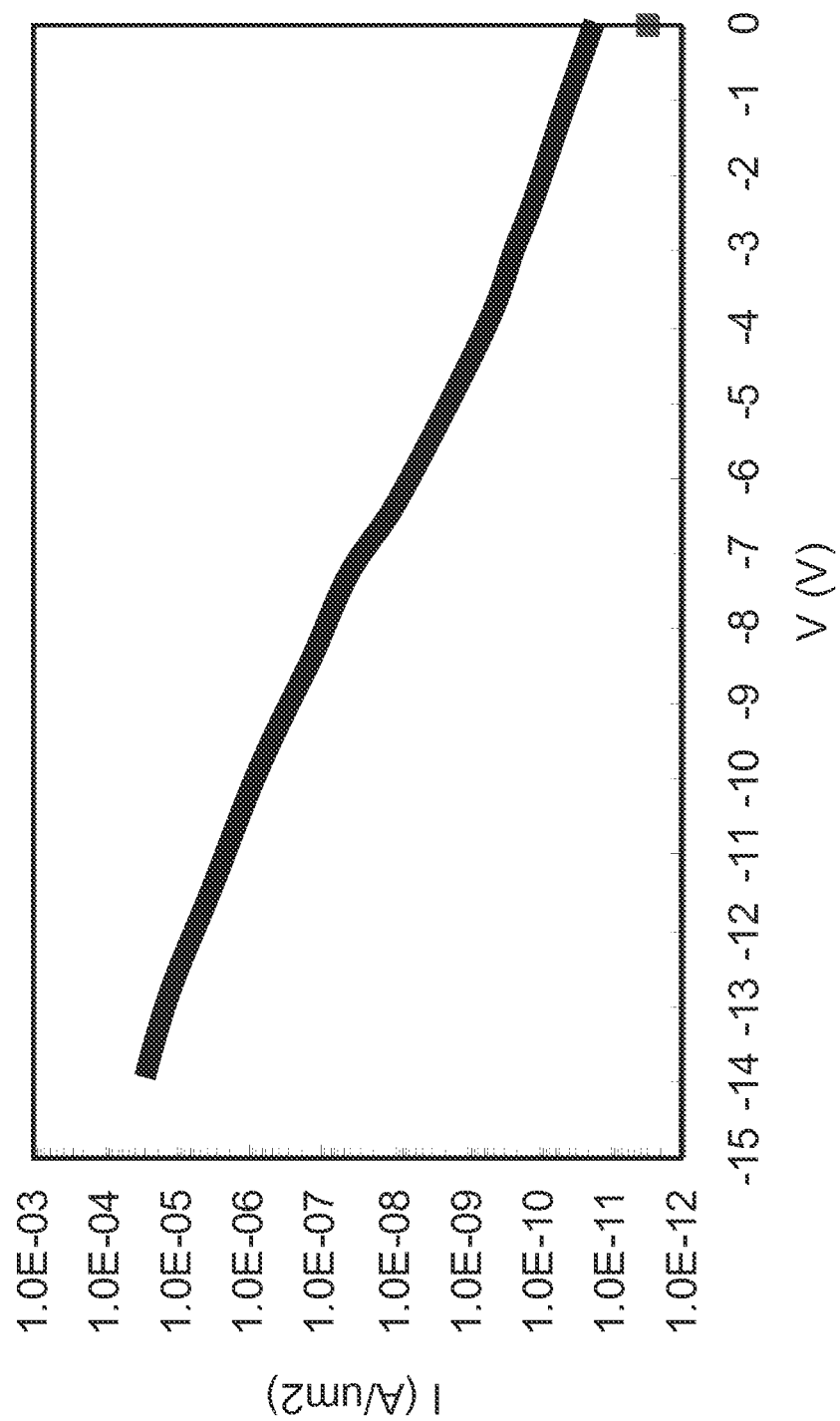
FIG. 1 (prior art) illustrates an I-V curve of a conventional device operated by a reverse bias.
Figure 2:
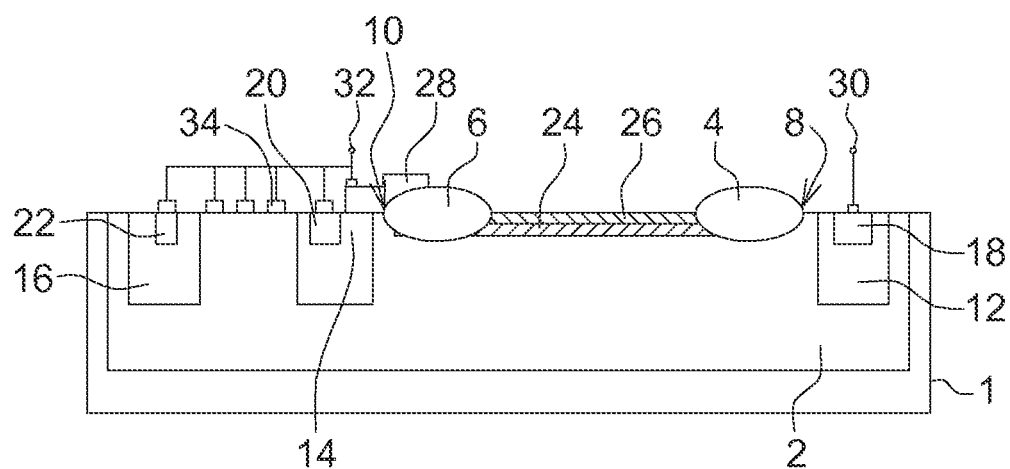
FIG. 2 illustrates a semiconductor structure and a manufacturing method for the semiconductor structure according to one embodiment.

FIG. 2 illustrates a semiconductor structure and a manufacturing method for the semiconductor structure according to one embodiment. Referring to FIG.2, a well region 21 is provided. The well region 21 may comprise bulk silicon, SOI, or other suitable semiconductor materials. The well region 21 may be a doped well region in a substrate material. Otherwise the well region 21 may also be a film formed by an epitaxial method or a non-epitaxial method such as vapor deposition method. A well region 2 is formed on the substrate 1. A first doped region 12 is formed in the well region 2 on the first dielectric sidewall 8. A second doped region 14 is formed in the well region 2 on the second dielectric sidewall 10. A third doped region 16 is also formed in the well region 2 on the second dielectric sidewall 10.

Referring to FIG. 2, a dielectric structure, comprising a first dielectric portion 4 and a second dielectric portion 6, is formed on the well region 2. The dielectric structure may comprise an oxide such as silicon oxide. The first dielectric portion 4 and the second dielectric portion 6 are not limited to the FOX as shown in FIG. 2. The first dielectric portion 4 and the second dielectric portion 6 may also comprise STI. The first dielectric portion 4 and the second dielectric portion 6 respectively have a first dielectric sidewall 8 and a second dielectric sidewall 10 far from each other. A first doped layer 24 is formed on the well region 2 between the first dielectric portion 4 and the second dielectric portion 6. A second doped layer 26 is formed on the first doped layer 24. In embodiments, the well region 2, the first doped layer 24, the first doped region 12 and the heavily doped portion 18 have a first conductivity type. The second doped region 14, the third doped region 16, the heavily-doped portion 20, the heavily-doped portion 22 and the second doped layer 26 have a second conductivity type opposite to the first conductivity type. For example, the first conductivity type is N type, and the second conductivity type is P type.

Referring to 2, a gate structure 28 may be formed on the second doped region 14 and the well region 2, and extended on the second dielectric portion 6. The gate structure 28 may comprise a gate dielectric layer and a gate electrode layer formed on the gate dielectric layer. The gate electrode layer may comprise metal or silicon such as polysilicon or metal silicide.

Referring to 2, a cathode 30 may be electrically connected to the first doped region 12 through the heavily doped portion 18 and a metal contact 34 having ohmic contact therebetween. An anode 32 may be electrically connected to the gate structure 28 through the metal contact 34 for providing ohmic contact. The anode 32 may also be electrically connected to the second doped region 14 and the third doped region 16, through the heavily doped portion 20, the heavily doped portion 22 and the metal contact 34 having ohmic contact therebetween. The anode 32 may also be electrically connected to the well region 2 between the second doped region 14 and the third doped region 16 through the metal contact 34. The metal contact 34 and the metal contact 34 may have a Schottky junction therebetween.

Referring to FIG. 2, in embodiments, the semiconductor structure may comprise a diode such as lateral Schottky diode. The first doped layer 24 and the second doped layer 26 formed on the drift region between the first dielectric portion 4 and the second dielectric portion 6 use RESURF concept. Thus, the Schottky breakdown of the device can be improved. The device can be operated by a high operating voltage. In addition, the device has a low Schottky barrier. Embodiments are not limited to the double-layer RESURF structure having the first doped layer 24 and the second doped layer 26 as shown in FIG. 2. Other multi-layer RESURF structure can also be used. The second doped region 14 and the third doped region 16 can form a pinching element for depleting the well region 2 between the second doped region 14 and the third doped region 16. Therefore, the device can have a low leakage current.

Figure 3:
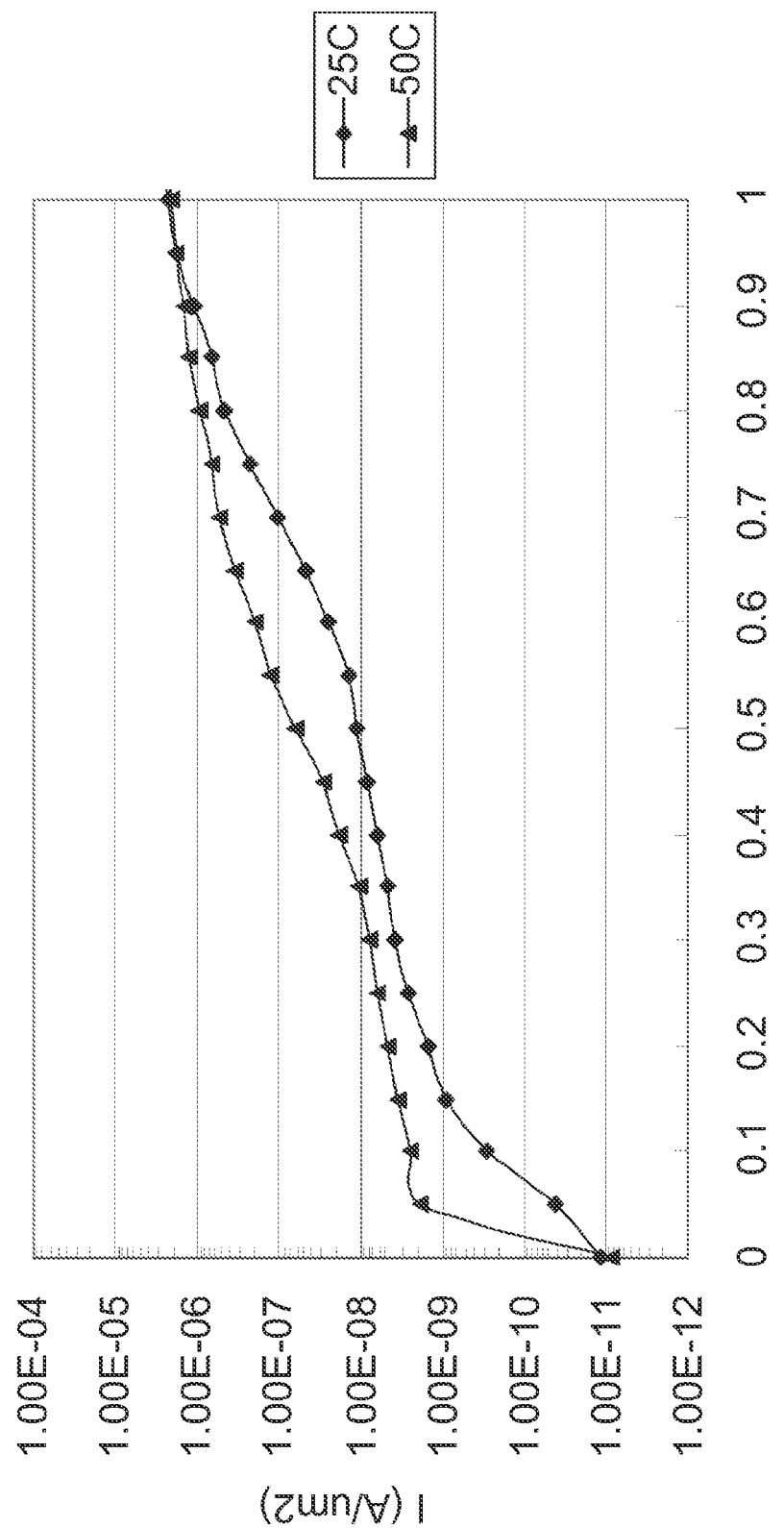
FIG. 3 illustrates an I-V curve of a device operated by a forward bias in one embodiment.
Figure 4:
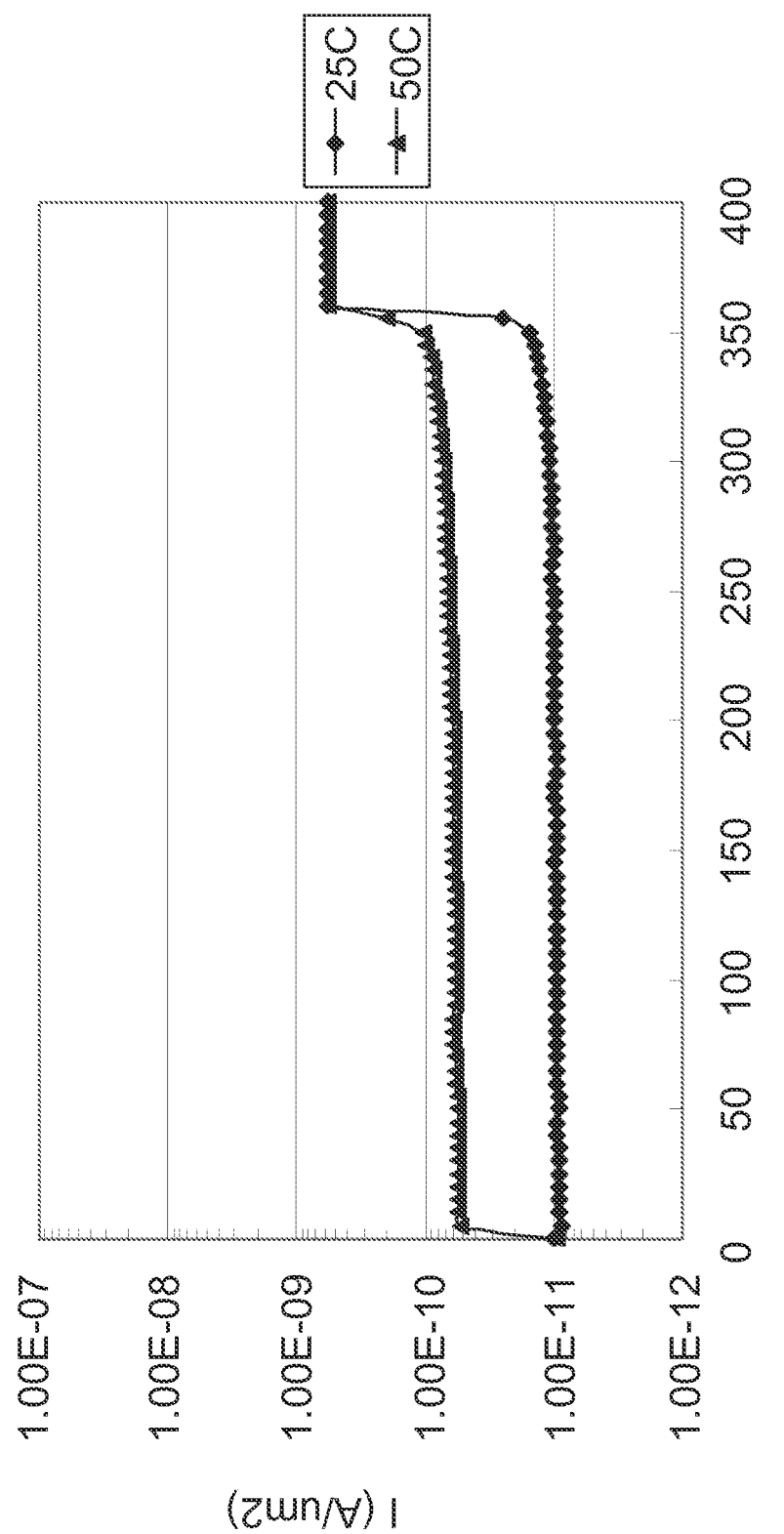
FIG. 4 illustrates an I-V curve of a device operated by a reverse bias in one embodiment.

FIG. 3 illustrates an I-V curve of the device operated by a forward bias in one embodiment. FIG. 4 illustrates an I-V curve of the device operated by a reverse bias. Referring to FIG. 3, the device has dual on-state resistance when operated by the forward bias. The resistance is switched at about 0.2V (Schottky diode breakdown) and 0.55V (PN type diode breakdown). Referring to FIG. 4, the device has a low leakage current when operated by a bias under about 350V. Thus, in embodiments, the semiconductor structure may comprise a Schottky diode and a PN type diode.

Figure 5:
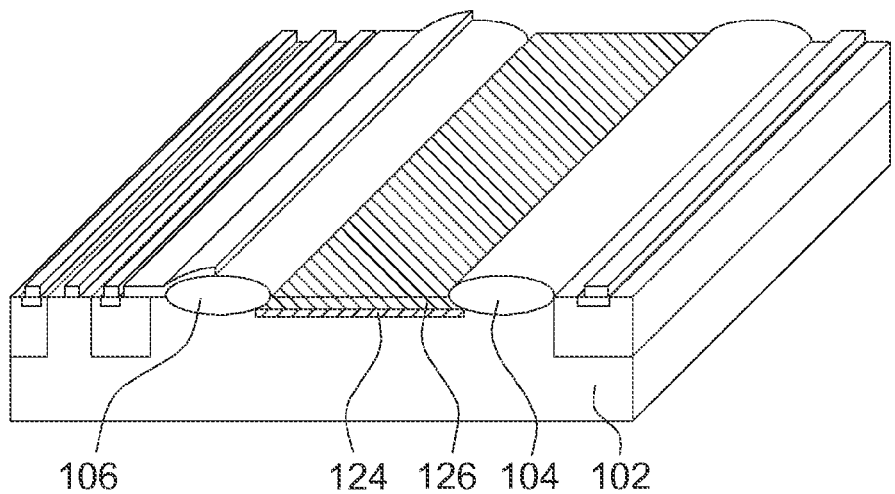
FIG. 5 illustrates a top view of a semiconductor structure according to one embodiment.

FIG. 5 illustrates a top view of the semiconductor structure according to one embodiment. Referring to FIG. 5, the first doped layer 124 and the second doped layer 126 are extended on the whole well region 102 between the first dielectric portion 104 and the second dielectric portion 106. In one embodiment, after the first dielectric portion 104 and the second dielectric portion 106 are formed, the first doped layer 124 and the second doped layer 126 are formed by doping the well region 102 exposed by the first dielectric portion 104 and the second dielectric portion 106 used as a shield layer. Therefore, the first doped layer 124 and the second doped layer 126 are formed without using a mask having a fine pattern. The formation method is simple. In addition, the cost for the formation is reduced.

Figure 6:
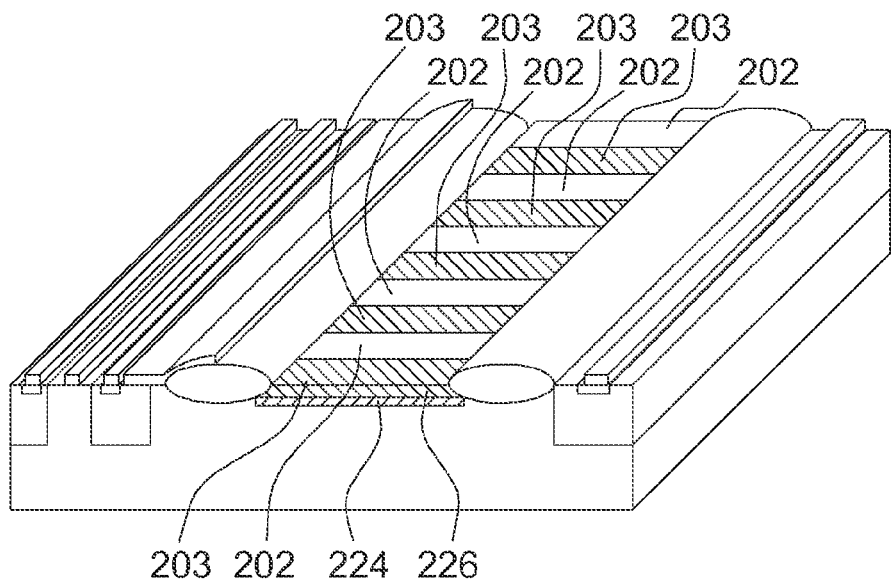
FIG. 6 illustrates a top view of a semiconductor structure according to one embodiment.

FIG. 6 illustrates a top view of the semiconductor structure according to one embodiment. Referring to FIG. 6, the first doped layer 224 and the second doped layer 226 are separated into doped strips 203 separated from each other by the well region 202.

Figure 7:
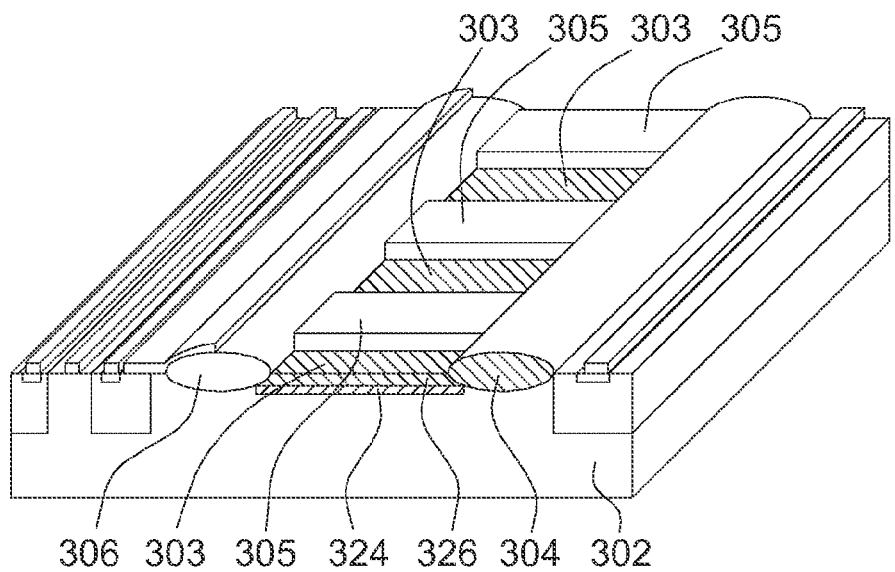
FIG. 7 illustrates a top view of a semiconductor structure according to one embodiment.

FIG. 7 illustrates a top view of the semiconductor structure according to one embodiment. Referring to FIG. 7, dielectric strips 305 are formed. The dielectric strips 305 are extended between the first dielectric portion 304 and the second dielectric portion 306. The first doped layer 324 and the second doped layer 326 are separated into the doped strips 303 separated from each other by the dielectric strips 305. In one embodiment, after the first dielectric portion 304, the second dielectric portion 306 and the dielectric strips 305 are formed, the doped strips 303 comprising the first doped layer 324 and the second doped layer 326 are formed by doping the well region 302 exposed by the first dielectric portion 304, the second dielectric portion 306 and the dielectric strips 305 used as a shield layer. Therefore, the first doped layer 324 and the second doped layer 326 are formed without using a mask having a fine pattern. The formation method is simple. In addition, the cost for the formation is reduced.

Figure 8:
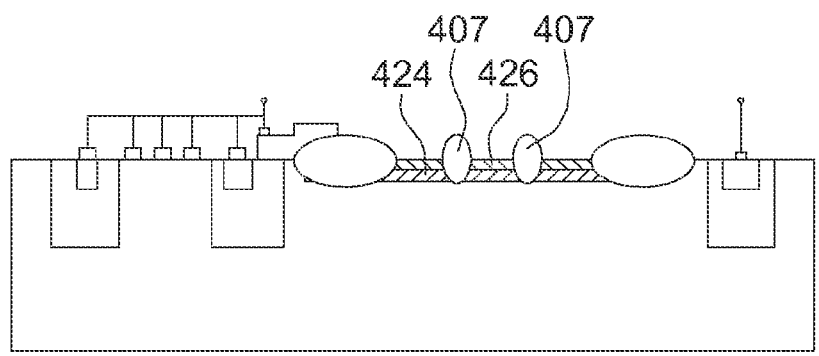
FIG. 8 illustrates a cross-section view of a semiconductor structure according to one embodiment.
Figure 9:
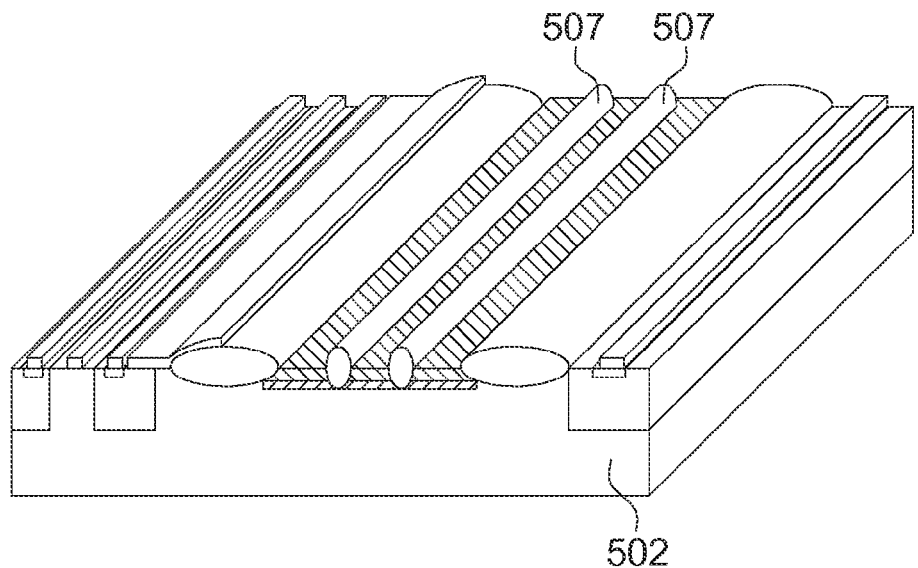
FIG. 9 illustrates a top view of a semiconductor structure according to one embodiment.
Figure 10:
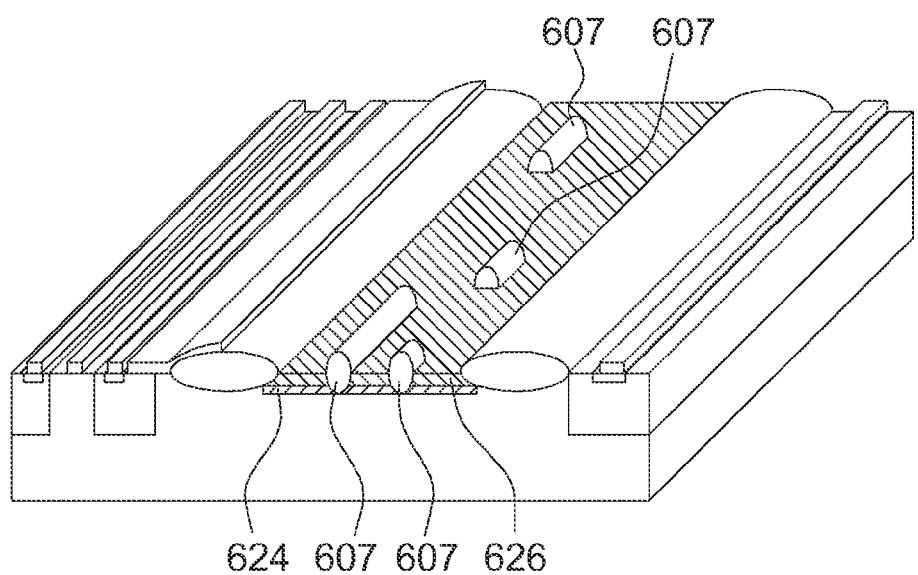
FIG. 10 illustrates a top view of a semiconductor structure according to one embodiment.

FIG. 8 illustrates a cross-section view of the semiconductor structure according to one embodiment. Referring to FIG. 8, a dielectric island 407 is formed in the first doped layer 424 and the second doped layer 426. The dielectric island 407 may comprise an oxide such as silicon oxide. The dielectric island 407 is not limited to the FOX as shown in FIG. 8. The dielectric island 407 may also comprise STI. FIG. 9 illustrates a top view of the semiconductor structure according to one embodiment. Referring to FIG. 9, the dielectric island 507 is extended on the well region 502. FIG. 10 illustrates a top view of the semiconductor structure according to one embodiment. Referring to FIG. 10, the dielectric island 607 can be properly arranged in the first doped layer 624 and the second doped layer 626 according to the desired device characteristic.

Figure 11:
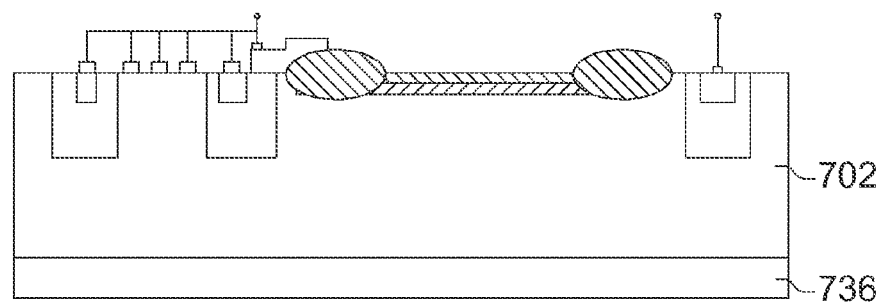
FIG. 11 illustrates a cross-section view of a semiconductor structure according to one embodiment.
Figure 12:
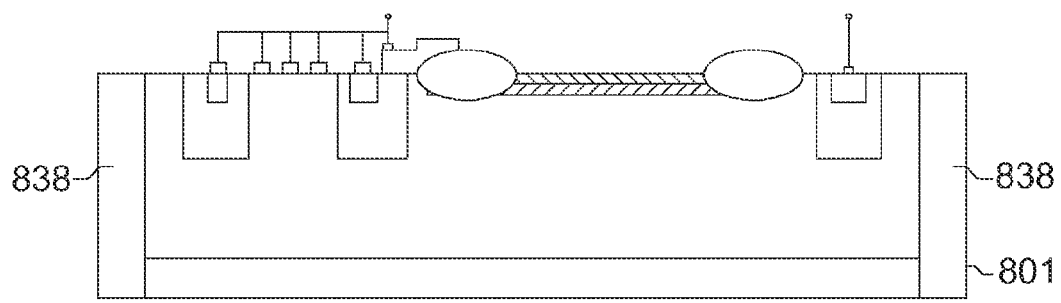
FIG. 12 illustrates a cross-section view of a semiconductor structure according to one embodiment.

FIG. 11 illustrates a cross-section view of the semiconductor structure according to one embodiment. The semiconductor structure shown in FIG. 11 differs from the semiconductor structure shown in FIG. 2 in that a buried layer 736 is formed on the well region 702. In embodiments, the well region 702 and the buried layer 736 have opposite conductivity types respectively. The operating voltage of the device can be increased by using the buried layer 736. FIG. 12 illustrates a cross-section view of the semiconductor structure according to another one embodiment. The semiconductor structure shown in FIG. 12 differs from the semiconductor structure shown in FIG. 11 in that a deep trench isolation 838 is formed in the substrate 801. The operating voltage of the device can also be increased by using the deep trench isolation 83.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a well region;
   a dielectric structure on the well region and having a first dielectric sidewall and a second dielectric sidewall opposite to each other;
   a first doped region in the well region; and
   a second doped region and a third doped region in the well region, wherein the well region and the first doped region have a first conductivity type, the second doped region and the third doped region have a second conductivity type opposite to the first conductivity type, a cathode is electrically connected to the first doped region, an anode is electrically connected to the well region between the second doped region and the third doped region, the second doped region and the third doped region form a pinching element.

2. The semiconductor structure according to claim 1, further comprising:
   a first doped layer on the well region between the first dielectric sidewall and the second dielectric sidewall;
   a second doped layer on the first doped layer; and
   a dielectric island in the first doped layer and the second doped layer.

3. The semiconductor structure according to claim 1, further comprising:
   a first doped layer on the well region between the first dielectric sidewall and the second dielectric sidewall;
   a second doped layer on the first doped layer, wherein the first doped layer and the second doped layer are separated into doped strips separated from each other by the well region.

4. The semiconductor structure according to claim 1, wherein the dielectric structure comprises a first dielectric portion and a second dielectric portion between the first dielectric sidewall and the second dielectric sidewall, the semiconductor structure further comprises:
   dielectric strips extended between the first dielectric portion and the second dielectric portion;
   a first doped layer on the well region between the first dielectric sidewall and the second dielectric sidewall; and
   a second doped layer on the first doped layer, wherein the first doped layer and the second doped layer are separated into doped strips separated from each other by the dielectric strips.

5. The semiconductor structure according to claim 1, the semiconductor structure comprises a Schottky diode and a PN type diode.

6. The semiconductor structure according to claim 1, wherein the pinching element is for depleting the well region between the second doped region and the third doped region.

7. The semiconductor structure according to claim 1, wherein the dielectric structure comprises a first dielectric portion and a second dielectric portion structure, the semiconductor structure further comprises:
   a first doped layer on the well region between the first dielectric portion and the second dielectric portion; and
   a second doped layer on the first doped layer, wherein the first doped layer has the first conductivity type, the second doped layer has the second conductivity type.

8. A manufacturing method for a semiconductor structure, comprising:
   forming a dielectric structure on a well region and having a first dielectric sidewall and a second dielectric sidewall opposite to each other;
   forming a first doped region in the well region; and
   forming a second doped region and a third doped region in the well region, wherein the well region and the first doped region have a first conductivity type, the second doped region and the third doped region have a second conductivity type opposite to the first conductivity type, a cathode is electrically connected to the first doped region, an anode is electrically connected to the well region between the second doped region and the third doped region, the second doped region and the third doped region form a pinching element.

9. The manufacturing method for the semiconductor structure according to claim 8, wherein the dielectric structure comprises a first dielectric portion and a second dielectric portion between the first dielectric sidewall and the second dielectric sidewall, the manufacturing method further comprises:
   forming dielectric strips, wherein the dielectric strips are extended between the first dielectric portion and the second dielectric portion;
   forming a first doped layer, wherein the first doped layer is formed on the well region between the dielectric strips; and
   forming a second doped layer on the first doped layer.

10. The manufacturing method for the semiconductor structure according to claim 9, wherein the first doped layer and the second doped layer are formed after forming the dielectric strips.

11. The manufacturing method for the semiconductor structure according to claim 10, wherein the first doped layer and the second doped layer are formed by using the dielectric strips as a shield layer.

12. The manufacturing method for the semiconductor structure according to claim 8, further comprising:
- forming a first doped layer, wherein the first doped layer is on the well region between the first dielectric sidewall and the second dielectric sidewall; and
- forming a second doped layer on the first doped layer, wherein the first doped layer and the second doped layer are formed after forming the dielectric structure.

13. The manufacturing method for the semiconductor structure according to claim 8, further comprising:
- forming a first doped layer, wherein the first doped layer is on the well region between the first dielectric sidewall and the second dielectric sidewall;
- forming a second doped layer on the first doped layer; and
- forming a dielectric island, wherein the dielectric island is in the first doped layer and the second doped layer.

14. The manufacturing method for the semiconductor structure according to claim 8, further comprising:
- forming a first doped layer, wherein the first doped layer is on the well region between the first dielectric sidewall and the second dielectric sidewall; and
- forming a second doped layer on the first doped layer, wherein the first doped layer and the second doped layer are separated into doped strips separated from each other by the well region.

\* \* \* \* \*